United States Patent
Fitzgerald et al.

(10) Patent No.: US 6,881,632 B2
(45) Date of Patent: Apr. 19, 2005

(54) METHOD OF FABRICATING CMOS INVERTER AND INTEGRATED CIRCUITS UTILIZING STRAINED SURFACE CHANNEL MOSFETS

(75) Inventors: Eugene A. Fitzgerald, Windham, NH (US); Nicole Gerrish, Cambridge, MA (US)

(73) Assignee: AmberWave Systems Corporation, Salem, NH (US)

( * ) Notice: Subject to any disclaimer, the term of this patent is extended or adjusted under 35 U.S.C. 154(b) by 0 days.

(21) Appl. No.: 10/611,739

(22) Filed: Jul. 1, 2003

(65) Prior Publication Data

US 2004/0097025 A1 May 20, 2004

Related U.S. Application Data

(63) Continuation of application No. 09/884,172, filed on Jun. 19, 2001, now Pat. No. 6,649,480.
(60) Provisional application No. 60/250,985, filed on Dec. 4, 2000.

(51) Int. Cl.[7] .............................................. H01L 21/336
(52) U.S. Cl. .................... 438/285; 438/199; 438/455
(58) Field of Search ................. 438/285–283, 438/199; 257/368–369

(56) References Cited

U.S. PATENT DOCUMENTS

| | | |
|---|---|---|
| 4,010,045 A | 3/1977 | Ruehrwein |
| 4,710,788 A | 12/1987 | Dämbkes et al. |
| 4,987,462 A | 1/1991 | Kim et al. ..................... 357/22 |
| 4,990,979 A | 2/1991 | Otto |
| 4,994,866 A | 2/1991 | Awano |
| 4,997,776 A | 3/1991 | Harame et al. |
| 5,013,681 A | 5/1991 | Godbey et al. |
| 5,089,872 A | 2/1992 | Ozturk et al. |

(Continued)

FOREIGN PATENT DOCUMENTS

| | | |
|---|---|---|
| DE | 41 01 167 | 7/1992 |
| EP | 0 514 018 | 11/1992 |

(Continued)

OTHER PUBLICATIONS

Armstrong et al., "Design of Si/SiGe Heterojunction Complementary Metal–Oxide–Semiconductor Transistors," *IEDM Technical Digest* (1995 International Electron Devices Meeting), pp. 761–764.

Armstrong, "Technology for SiGe Heterostructure–Based CMOS Devices," PhD Thesis, Massachusetts Institute of Technology, 1999, pp. 1–154.

Augusto et al., "Proposal for a New Process Flow for the Fabrication of Silicon–Based Complementary MOD–MOSFETs without Ion Implantation," *Thin Solid Films*, vol. 294, No. 1–2 (Feb. 15, 1997), pp. 254–258.

(Continued)

*Primary Examiner*—Dung A. Le
(74) *Attorney, Agent, or Firm*—Testa, Hurwitz & Thibeault, LLP

(57) ABSTRACT

A method of fabricating a CMOS inverter including providing a heterostructure having a Si substrate, a relaxed $Si_{1-x}Ge_x$ layer on the Si substrate, and a strained surface layer on said relaxed $Si_{1-x}Ge_x$ layer; and integrating a pMOSFET and an nMOSFET in said heterostructure, wherein the channel of said pMOSFET and the channel of the nMOSFET are formed in the strained surface layer. Another embodiment provides a method of fabricating an integrated circuit including providing a heterostructure having a Si substrate, a relaxed $Si_{1-x}Ge_x$ layer on the Si substrate, and a strained layer on the relaxed $Si_{1-x}Ge_x$ layer; and forming a p transistor and an n transistor in the heterostructure, wherein the strained layer comprises the channel of the n transistor and the p transistor, and the n transistor and the p transistor are interconnected in a CMOS circuit.

16 Claims, 13 Drawing Sheets

U.S. PATENT DOCUMENTS

| | | |
|---|---|---|
| 5,155,571 A | 10/1992 | Wang et al. |
| 5,166,084 A | 11/1992 | Pfiester |
| 5,177,583 A | 1/1993 | Endo et al. |
| 5,202,284 A | 4/1993 | Kamins et al. |
| 5,207,864 A | 5/1993 | Bhat et al. |
| 5,208,182 A | 5/1993 | Narayan et al. |
| 5,212,110 A | 5/1993 | Pfiester et al. |
| 5,221,413 A | 6/1993 | Brasen et al. |
| 5,240,876 A | 8/1993 | Gaul et al. .................. 437/131 |
| 5,241,197 A | 8/1993 | Murakami et al. |
| 5,242,847 A | 9/1993 | Ozturk et al. |
| 5,250,445 A | 10/1993 | Bean et al. |
| 5,285,086 A | 2/1994 | Fitzgerald |
| 5,291,439 A | 3/1994 | Kauffmann et al. |
| 5,298,452 A | 3/1994 | Meyerson |
| 5,310,451 A | 5/1994 | Tejwani et al. |
| 5,316,958 A | 5/1994 | Meyerson |
| 5,346,848 A | 9/1994 | Grupen-Shemansky et al. |
| 5,374,564 A | 12/1994 | Bruel |
| 5,399,522 A | 3/1995 | Ohori |
| 5,413,679 A | 5/1995 | Godbey |
| 5,424,243 A | 6/1995 | Takasaki ..................... 437/132 |
| 5,426,069 A | 6/1995 | Selvakumar et al. |
| 5,426,316 A | 6/1995 | Mohammad |
| 5,442,205 A | 8/1995 | Brasen et al. |
| 5,461,243 A | 10/1995 | Ek et al. |
| 5,461,250 A | 10/1995 | Burghartz et al. |
| 5,462,883 A | 10/1995 | Dennard et al. |
| 5,476,813 A | 12/1995 | Naruse |
| 5,479,033 A | 12/1995 | Baca et al. |
| 5,484,664 A | 1/1996 | Kitahara et al. |
| 5,523,243 A | 6/1996 | Mohammad |
| 5,523,592 A | 6/1996 | Nakagawa et al. |
| 5,534,713 A | 7/1996 | Ismail et al. |
| 5,536,361 A | 7/1996 | Kondo et al. |
| 5,540,785 A | 7/1996 | Dennard et al. |
| 5,572,043 A | 11/1996 | Shimizu et al. ............... 257/18 |
| 5,596,527 A | 1/1997 | Tomioka et al. |
| 5,617,351 A | 4/1997 | Bertin et al. |
| 5,630,905 A | 5/1997 | Lynch et al. |
| 5,659,187 A | 8/1997 | Legoues et al. |
| 5,683,934 A | 11/1997 | Candelaria |
| 5,698,869 A | 12/1997 | Yoshimi et al. |
| 5,714,777 A | 2/1998 | Ismail et al. |
| 5,728,623 A | 3/1998 | Mori |
| 5,739,567 A | 4/1998 | Wong |
| 5,759,898 A | 6/1998 | Ek et al. |
| 5,777,347 A | 7/1998 | Bartelink |
| 5,786,612 A | 7/1998 | Otani et al. |
| 5,786,614 A | 7/1998 | Chuang et al. ............. 257/318 |
| 5,792,679 A | 8/1998 | Nakato |
| 5,808,344 A | 9/1998 | Ismail et al. |
| 5,847,419 A | 12/1998 | Imai et al. |
| 5,877,070 A | 3/1999 | Goesele et al. |
| 5,891,769 A | 4/1999 | Liaw et al. |
| 5,906,708 A | 5/1999 | Robinson et al. |
| 5,906,951 A | 5/1999 | Chu et al. |
| 5,912,479 A | 6/1999 | Mori et al. |
| 5,943,560 A | 8/1999 | Chang et al. |
| 5,963,817 A | 10/1999 | Chu et al. |
| 5,966,622 A | 10/1999 | Levine et al. |
| 5,998,807 A | 12/1999 | Lustig et al. |
| 6,013,134 A | 1/2000 | Chu et al. |
| 6,033,974 A | 3/2000 | Henley et al. |
| 6,033,995 A | 3/2000 | Muller |
| 6,058,044 A | 5/2000 | Sugiura et al. |
| 6,059,895 A | 5/2000 | Chu et al. |
| 6,074,919 A | 6/2000 | Gardner et al. |
| 6,096,590 A | 8/2000 | Chan et al. |
| 6,103,559 A | 8/2000 | Gardner et al. |
| 6,107,653 A | 8/2000 | Fitzgerald |
| 6,111,267 A | 8/2000 | Fischer et al. |
| 6,117,750 A | 9/2000 | Bensahel et al. |
| 6,130,453 A | 10/2000 | Mei et al. |
| 6,133,799 A | 10/2000 | Favors et al. |
| 6,140,687 A | 10/2000 | Shimomura et al. |
| 6,143,636 A | 11/2000 | Forbes et al. |
| 6,153,495 A | 11/2000 | Kub et al. |
| 6,154,475 A | 11/2000 | Soref et al. |
| 6,160,303 A | 12/2000 | Fattaruso |
| 6,162,688 A | 12/2000 | Gardner et al. |
| 6,184,111 B1 | 2/2001 | Henley et al. |
| 6,191,007 B1 | 2/2001 | Matsui et al. |
| 6,191,432 B1 | 2/2001 | Sugiyama et al. |
| 6,194,722 B1 | 2/2001 | Fiorini et al. |
| 6,204,529 B1 | 3/2001 | Lung et al. |
| 6,207,977 B1 | 3/2001 | Augusto |
| 6,210,988 B1 | 4/2001 | Howe et al. |
| 6,218,677 B1 | 4/2001 | Broekaert |
| 6,228,694 B1 | 5/2001 | Doyle et al. |
| 6,232,138 B1 | 5/2001 | Fitzgerald et al. |
| 6,235,567 B1 | 5/2001 | Huang |
| 6,235,568 B1 | 5/2001 | Murthy et al. |
| 6,242,324 B1 * | 6/2001 | Kub et al. .................. 438/455 |
| 6,249,022 B1 | 6/2001 | Lin et al. |
| 6,251,755 B1 | 6/2001 | Furukawa et al. |
| 6,261,929 B1 | 7/2001 | Gehrke et al. |
| 6,266,278 B1 | 7/2001 | Harari et al. |
| 6,271,551 B1 | 8/2001 | Schmitz et al. |
| 6,271,726 B1 | 8/2001 | Fransis et al. |
| 6,281,532 B1 | 8/2001 | Doyle et al. |
| 6,291,321 B1 | 9/2001 | Fitzgerald |
| 6,313,016 B1 | 11/2001 | Kibbel et al. |
| 6,316,301 B1 | 11/2001 | Kant |
| 6,323,108 B1 | 11/2001 | Kub et al. |
| 6,326,664 B1 | 12/2001 | Chau et al. |
| 6,329,063 B1 | 12/2001 | Lo et al. |
| 6,335,546 B1 | 1/2002 | Tsuda et al. |
| 6,339,232 B1 | 1/2002 | Takagi |
| 6,350,993 B1 | 2/2002 | Chu et al. |
| 6,352,909 B1 | 3/2002 | Usenko ..................... 438/458 |
| 6,368,733 B1 | 4/2002 | Nishinaga |
| 6,372,356 B1 | 4/2002 | Thornton et al. |
| 6,399,970 B1 | 6/2002 | Kubo et al. |
| 6,403,975 B1 | 6/2002 | Brunner et al. |
| 6,407,406 B1 | 6/2002 | Tezuka |
| 6,420,937 B1 | 7/2002 | Akatsuka et al. |
| 6,425,951 B1 | 7/2002 | Chu et al. |
| 6,429,061 B1 | 8/2002 | Rim |
| 6,521,041 B1 | 2/2003 | Wu et al. |
| 6,524,935 B1 | 2/2003 | Canaperi et al. |
| 6,555,839 B1 | 4/2003 | Fitzgerald |
| 6,563,152 B1 | 5/2003 | Roberds et al. |
| 6,573,126 B1 | 6/2003 | Cheng et al. |
| 6,583,015 B1 | 6/2003 | Fitzgerald et al. |
| 6,593,191 B1 | 7/2003 | Fitzgerald |
| 6,602,613 B1 | 8/2003 | Fitzgerald |
| 6,605,498 B1 | 8/2003 | Murthy et al. |
| 6,621,131 B1 | 9/2003 | Murthy et al. |
| 6,646,322 B1 | 11/2003 | Fitzgerald .................. 257/531 |
| 6,649,480 B1 | 11/2003 | Fitzgerald et al. |
| 6,657,223 B1 | 12/2003 | Wang et al. |
| 6,677,192 B1 | 1/2004 | Fitzgerald .................. 438/172 |
| 6,682,965 B1 | 1/2004 | Noguchi et al. |
| 6,703,144 B1 | 3/2004 | Fitzgerald .................. 428/641 |
| 6,703,648 B1 | 3/2004 | Xiang et al. |
| 6,703,688 B1 | 3/2004 | Fitzergald .................. 257/616 |
| 6,709,903 B1 | 3/2004 | Christiansen ............... 438/149 |
| 6,713,326 B1 | 3/2004 | Cheng et al. ............... 438/149 |
| 6,723,661 B1 | 4/2004 | Fitzgerald .................. 438/763 |
| 6,737,670 B1 | 5/2004 | Cheng et al. ................ 257/19 |

| | | |
|---|---|---|
| 6,743,684 B1 | 6/2004 | Liu |
| 6,750,130 B1 | 6/2004 | Fitzgerald ............... 438/607 |
| 2001/0003364 A1 | 6/2001 | Sugawara et al. |
| 2002/0043660 A1 | 4/2002 | Yamazaki et al. |
| 2002/0063292 A1 | 5/2002 | Armstrong et al. |
| 2002/0084000 A1 | 7/2002 | Fitzgerald ............. 148/33.2 |
| 2002/0096717 A1 | 7/2002 | Chu et al. |
| 2002/0100942 A1 | 8/2002 | Fitzgerald et al. |
| 2002/0123167 A1 | 9/2002 | Fitzgerald |
| 2002/0123183 A1 | 9/2002 | Fitzgerald |
| 2002/0123197 A1 | 9/2002 | Fitzgerald et al. |
| 2002/0125471 A1 | 9/2002 | Fitzgerald et al. |
| 2002/0125497 A1 | 9/2002 | Fitzgerald |
| 2002/0140031 A1 | 10/2002 | Rim |
| 2002/0168864 A1 | 11/2002 | Cheng et al. |
| 2002/0190284 A1 | 12/2002 | Murthy et al. |
| 2003/0003679 A1 | 1/2003 | Doyle et al. |
| 2003/0013323 A1 | 1/2003 | Hammond et al. |
| 2003/0025131 A1 | 2/2003 | Lee et al. |
| 2003/0034529 A1 | 2/2003 | Fitzgerald et al. ......... 257/369 |
| 2003/0057439 A1 | 3/2003 | Fitzgerald |
| 2003/0102498 A1 | 6/2003 | Braithwaite et al. ....... 257/288 |
| 2003/0199126 A1 | 10/2003 | Chu et al. .................. 438/149 |
| 2003/0203600 A1 | 10/2003 | Chu et al. .................. 438/479 |
| 2003/0215990 A1 | 11/2003 | Fitzgerald et al. ......... 438/172 |
| 2003/0218189 A1 | 11/2003 | Christiansen ............. 257/200 |
| 2003/0227057 A1 | 12/2003 | Lochtefeld et al. ........ 257/347 |
| 2004/0005740 A1 | 1/2004 | Lochtefeld et al. ........ 438/149 |
| 2004/0007724 A1 | 1/2004 | Murthy et al. |
| 2004/0014276 A1 | 1/2004 | Murthy et al. |
| 2004/0014304 A1 | 1/2004 | Bhattacharyya ........... 438/570 |
| 2004/0031979 A1 | 2/2004 | Lochtefeld ................ 257/233 |
| 2004/0041210 A1 | 3/2004 | Mouli ...................... 257/347 |
| 2004/0070035 A1 | 4/2004 | Murthy et al. |
| 2004/0075149 A1 | 4/2004 | Fitzgerald et al. ......... 257/369 |
| 2004/0084735 A1 | 5/2004 | Murthy et al. |
| 2004/0119101 A1 | 6/2004 | Schrom et al. |
| 2004/0142545 A1 | 7/2004 | Ngo et al. |
| 2004/0173815 A1 | 9/2004 | Yeo et al. |

FOREIGN PATENT DOCUMENTS

| | | |
|---|---|---|
| EP | 0 587 520 | 3/1994 |
| EP | 0 683 522 | 11/1995 |
| EP | 0 828 296 | 3/1998 |
| EP | 0 829 908 | 3/1998 |
| EP | 0 838 858 | 4/1998 |
| EP | 1 020 900 | 7/2000 |
| EP | 1 174 928 | 1/2002 |
| FR | 2 701 599 | 3/1995 |
| GB | 2 342 777 | 4/2000 |
| JP | 61-141116 | 6/1986 |
| JP | 2-210816 | 8/1990 |
| JP | 3-036717 | 2/1991 |
| JP | 4-307974 | 10/1992 |
| JP | 5-166724 | 7/1993 |
| JP | 6-177046 | 6/1994 |
| JP | 6-244112 | 9/1994 |
| JP | 6-252046 | 9/1994 |
| JP | 7-94420 | 4/1995 |
| JP | 7-106446 | 4/1995 |
| JP | 7-240372 | 9/1995 |
| JP | 10-270685 | 10/1998 |
| JP | 11-233744 | 8/1999 |
| JP | 2000-021783 | 1/2000 |
| JP | 2000-031491 | 1/2000 |
| JP | 2001-319935 | 11/2001 |
| JP | 2002-076334 | 3/2002 |
| JP | 2002-164520 | 6/2002 |
| JP | 2002-289533 | 10/2002 |
| WO | 98/59365 | 12/1998 |
| WO | 99/53539 | 10/1999 |
| WO | 00/48239 | 8/2000 |
| WO | 00/54338 | 9/2000 |
| WO | 01/022482 | 3/2001 |
| WO | 01/54202 | 7/2001 |
| WO | 01/93338 | 12/2001 |
| WO | 01/99169 | 12/2001 |
| WO | 02/13262 | 2/2002 |
| WO | 02/15244 | 2/2002 |
| WO | 02/27783 | 4/2002 |
| WO | 02/47168 | 6/2002 |
| WO | 02/071488 | 9/2002 |
| WO | 02/071491 | 9/2002 |
| WO | 02/071495 | 9/2002 |
| WO | 02/082514 | 10/2002 |
| WO | 2004/006327 | 1/2004 |
| WO | 2004/0006311 | 1/2004 |

OTHER PUBLICATIONS

Barradas et al., "RBS analysis of MBE–grown SiGe/(001) Si heterostructures with thin, high Ge content SiGe channels for HMOS transistors," *Modern Physics Letters B*, vol. 15 (2001), abstract.

Borenstein et al., "A New Ultra–Hard Etch–Stop Layer for High Precision Micromachining," Proceedings of the 1999 12th IEEE International Conference on Micro Electro Mechanical Systems (MEMs) (Jan. 17–21, 1999), pp. 205–210.

Bouillon et al., "Search for the optimal channel architecture for 0.18/0.12 $\mu$m bulk CMOS experimental study," *IEEE* (1996), pp. 21.2.1–21.2.4.

Bruel et al., "®Smart Cut: A Promising New SOI Material Technology," Proceedings of the 1995 IEEE International SOI Conference (Oct. 1995), pp. 178–179.

Bruel, "Silicon on Insulator Material Technology," *Electronic Letters*, vol. 13, No. 14 (Jul. 6, 1995), pp. 1201–1202.

Bufler et al., "Hole transport in strained Si1–xGex alloys on Si1–yGey substrates," *Journal of Applied Physics*, vol. 84, No. 10 (Nov. 15, 1998), pp. 5597–5602.

Burghartz et al., "Microwave Inductors and Capacitors in Standard Multilevel Interconnect Silicon Technology," *IEEE Transactions on Microwave Theory and Techniques*, vol. 44, No. 1 (Jan. 1996), pp. 100–104.

Canaperi et al., "Preparation of a relaxed Si–Ge layer on an insulator in fabricating high–speed semiconductor devices with strained epitaxial films," International Business Machines Corporation, USA (2002), abstract.

Carlin et al., "High Efficiency GaAs–on–Si Solar Cells with High Voc using Graded GeSi Buffers," *IEEE—2000* (2000), pp. 1006–1011.

Chang et al., "Selective Etching of SiGe/Si Heterostructures," *Journal of the Electrochemical Society*, No. 1 (Jan. 1991), pp. 202–204.

Cheng et al., "Electron Mobility Enhancement in Strained–Si n–MOSFETs Fabricated on SiGe–on–Insulator (SGOI) Substrates," *IEEE Electron Device Letters*, vol. 22, No. 7 (Jul. 2001), pp. 321–323.

Cheng et al., "Relaxed Silicon–Germanium on Insulator Substrate by Layer Transfer," *Journal of Electronic Materials*, vol. 30, No. 12 (2001), pp. L37–L39.

Cullis et al., "Growth ripples upon strained SiGe epitaxial layers on Si and misfit dislocation interactions," *Journal of Vacuum Science and Technology A*, vol. 12, No. 4 (Jul./Aug. 1994), pp. 1924–1931.

Currie et al., "Carrier mobilities and process stability of strained Si n- and p-MOSFETs on SiGe virtual substrates," *Journal of Vacuum Science and Technology B*, vol. 19, No. 6 (Nov./Dec. 2001), pp. 2268–2279.

Currie et al., "Controlling Threading Dislocation Densities in Ge on Si Using Graded SiGe Layers and Chemical–Mechanical Polishing," *Applied Physics Letters*, vol. 72, Issue 14 (Apr. 6, 1998), pp. 1718–1720.

Eaglesham et al., "Dislocation–Free Stranski–Krastanow Growth of Ge on Si(100)," *Physical Review Letters*, vol. 64, No. 16 (Apr. 16, 1990), pp. 1943–1946.

Feijoo et al., "Epitaxial Si–Ge Etch Stop Layers with Ethylene Diamine Pyrocatechol for Bonded and Etchback Silicon–on–Insulator," *Journal of Electronic Materials*, vol. 23, No. 6 (Jun. 1994), pp. 493–496.

Fischetti et al., "Band structure, deformation potentials, and carrier mobility in strained Si, Ge, and SiGe alloys," *Journal of Applied Physics*, vol. 80, No. 4 (Aug. 15, 1996), pp. 2234–2252.

Fischetti, "Long–range Coulomb interactions in small Si devices. Part II. Effective electronmobility in thin–oxide structures," *Journal of Applied Physics*, vol. 89, No. 2 (Jan. 15, 2001), pp. 1232–1250.

Fitzgerald et al., "Dislocation dynamics in relaxed graded composition semiconductors," *Materials Science and Engineering*, B67 (1999), pp. 53–61.

Fitzgerald et al., "Relaxed $Ge_xSi_{1-x}$ structures for III–V integration with Si and high mobility two–dimensional electron gases in Si," *Journal of Vacuum Science Technology*, B 10(4) (Jul./Aug. 1992), pp. 1807–1819.

Fitzgerald et al., "Totally Relaxed $Ge_xSi_{1-x}$ Layers with Low Threading Dislocation Densities Grown on Si Substrates," *Applied Physics Letters*, vol. 59, No. 7 (Aug. 12, 1991), pp. 811–813.

Garone et al., "Silicon vapor phase epitaxial growth catalysis by the presence of germane," *Applied Physics Letters*, vol. 56, No. 13 (Mar. 26, 1990), pp. 1275–1277.

Gray et al., "Analysis and Design of Analog Integrated Circuits," John Wiley & Sons, 1984, pp. 605–632.

Grützmacher et al., "Ge segregation in SiGe/Si heterostructures and its dependence on deposition technique and growth atmosphere," *Applied Physics Letters*, vol. 63, No. 18 (Nov. 1, 1993), pp. 2531–2533.

Hackbarth et al., "Alternatives to thick MBE–grown relaxed SiGe buffers," *Thin Solid Films*, vol. 369, No. 1–2 (Jul. 2000), pp. 148–151.

Hackbarth et al., "Strain relieved SiGe buffers for Si–based heterostructure field–effect transistors," *Journal of Crystal Growth*, vol. 201/202 (1999), pp. 734–738.

Herzog et al., "SiGe–based FETs: buffer issues and device results," *Thin Solid Films*, vol. 380 (2000), pp. 36–41.

Höck et al., "Carrier mobilities in modulation doped $Si_{1-x}Ge_x$ heterostructures with respect to FET applications," *Thin Solid Films*, vol. 336 (1998), pp. 141–144.

Höck et al., "High hole mobility in $Si_{0.17}Ge_{0.83}$ channel metal–oxide–semiconductor field–effect transistors grown by plasma–enhanced chemical vapor deposition," *Applied Physics Letters*, vol. 76, No. 26 (Jun. 26, 2000), pp. 3920–3922.

Höck et al., "High performance 0.25 $\mu$m p–type Ge/SiGe MODFETs," *Electronics Letters*, vol. 34, No. 19 (Sep. 17, 1998), pp. 1888–1889.

Huang et al., "High–quality strain–relaxed SiGe alloy grown on implanted silicon–on–insulator substrate," *Applied Physics Letters*, vol. 76, No. 19 (May 8, 2000), pp. 2680–2682.

Huang et al., "The Impact of Scaling Down to Deep Submicron on CMOS RF Circuits," *IEEE Journal of Solid–State Circuits*, vol. 33, No. 7 (Jul. 1998), pp. 1023–1036.

Ishikawa et al., "Creation of Si–Ge–based SIMOX structures by low energy oxygen implantation," Proceedings of the 1997 IEEE International SOI Conference (Oct. 1997), pp. 16–17.

Ishikawa et al., "SiGe–on–insulator substrate using SiGe alloy grown Si(001)," *Applied Physics Letters*, vol. 75, No. 7 (Aug. 16, 1999), pp. 983–985.

Ismail et al., "Modulation–doped n–type Si/SiGe with inverted interface," *Applied Physics Letters*, vol. 65, No. 10 (Sep. 5, 1994), pp. 1248–1250.

Ismail, "Si/SiGe High–Speed Field–Effect Transistors," Electron Devices Meeting, Washington, D.C., (Dec. 10, 1995), pp. 20.1.1–20.1.4.

Kearney et al., "The effect of alloy scattering on the mobility of holes in a $Si_{1-x}Ge_x$ quantum well," *Semiconductor Science and Technology*, vol. 13 (1998), pp. 174–180.

Kim et al., "A Fully Integrated 1.9–GHz CMOS Low–Noise Amplifier," *IEEE Microwave and Guided Wave Letters*, vol. 8, No. 8 (Aug. 1998), pp. 293–295.

Koester et al., "Extremely High Transconductance $Ge/Si_{0.4}Ge_{0.6}$ p–MODFET's Grown by UHV–CVD," *IEEE Electron Device Letters*, vol. 21, No. 3 (Mar. 2000), pp. 110–112.

König et al., "Design Rules for n–Type SiGe Hetero FETs," *Solid State Electronics*, vol. 41, No. 10 (1997), pp. 1541–1547.

König et al., "p–Type Ge–Channel MODFET's with High Transconductance Grown on Si Substrates," *IEEE Electron Device Letters*, vol. 14, No. 4 (Apr. 1993), pp. 205–207.

König et al., "SiGe HBTs and HFETs," *Solid–State Electronics*, vol. 38, No. 9 (1995), pp. 1595–1602.

Kummer et al., "Low energy plasma enhanced chemical vapor deposition," *Materials Science and Engineering*, B89 (2002), pp. 288–295.

Kuznetsov et al., "Technology for high–performance n–channel SiGe modulation–doped field–effect transistors," *Journal of Vacuum Science and Technology*, B 13(6) (Nov./Dec. 1995), pp. 2892–2896.

Larson, "Integrated Circuit Technology Options for RFIC's Present Status and Future Directions," *IEEE Journal of Solid–State Circuits*, vol. 33, No. 3 (Mar. 1998), pp. 387–399.

Lee et al., "CMOS RF Integrated Circuits at 5 GHz and Beyond," *Proceedings of the IEEE*, vol. 88, No. 10 (Oct. 2000), pp. 1560–1571.

Lee et al., "Strained Ge channel p–type metal–oxide–semiconductor field–effect transistors grown on $Si_{1-x}Ge_x$/Si virtual substrates," *Applied Physics Letters*, vol. 79, No. 20 (Nov. 12, 2001), pp. 3344–3346.

Lee et al., "Strained Ge channel p–type MOSFETs fabricated on $Si_{1-x}Ge_x$/Si virtual substrates," *Materials Research Society Symposium Proceedings*, vol. 686 (2002), pp. A1.9.1–A1.9.5.

Leitz et al., "Channel Engineering of SiGe–Based Heterostructures for High Mobility MOSFETs," *Materials Research Society Symposium Proceedings*, vol. 686 (2002), pp. A3.10.1–A3.10.6.

Leitz et al., "Dislocation glide and blocking kinetics in compositionally graded SiGe/Si," *Journal of Applied Physics*, vol. 90, No. 6 (Sep. 15, 2001), pp. 2730–2736.

Leitz et al., "Hole mobility enhancements in strained Si/Si1–yGey p–type metal–oxide–semiconductor field–effect transistors grown on relaxed Si1–xGex (x<y) virtual substrates," *Applied Physics Letters*, vol. 79, No. 25 (Dec. 17, 2001), pp. 4246–4248.

Li et al., "Design of high speed Si/SiGe heterojunction complementary metal–oxide–semiconductor field effect transistors with reduced short–channel effects," *Journal of Vacuum Science and Technology A*, vol. 20, No. 3 (May/Jun. 2002), pp. 1030–1033.

Lu et al., "High Performance 0.1 $\mu$m Gate–Length P–Type SiGe MODFET's and MOS–MODFET's," *IEEE Transactions on Electron Devices*, vol. 47, No. 8 (Aug. 2000), pp. 1645–1652.

Maiti et al., "Strained–Si heterostructure field effect transistors," *Semiconductor Science and Technology*, vol. 13 (1998), pp. 1225–1246.

Maszara, "Silicon–On–Insulator by Wafer Bonding: A Review," *Journal of the Electrochemical Society*, No. 1 (Jan. 1991), pp. 341–347.

Meyerson et al., "Cooperative Growth Phenomena in Silicon/Germanium Low–Temperature Epitaxy," *Applied Physics Letters*, vol. 53, No. 25 (Dec. 19, 1988), pp. 2555–2557.

Mizuno et al., "Advanced SOI–MOSFETs with Strained–Si Channel for High Speed CMOS–Electron/Hole Mobility Enhancement," 2002 Symposium on VLSI Technology, Honolulu (Jun. 13–15), *IEEE New York*, pp. 210–211.

Mizuno et al., "Electron and Hole Mobility Enhancement in Strained–Si MOSFET's on SiGe–on–Insulator Substrates Fabricated by SIMOX Technology," *IEEE Electron Device Letters*, vol. 21, No. 5 (May 2000), pp. 230–232.

Mizuno et al., "High Performance Strained–Si p–MOSFETs on SiGe–on–Insulator Substrates Fabricated by SIMOX Technology," *IEEE IDEM Technical Digest* (1999 International Electron Device Meeting), pp. 934–936.

Nayak et al., "High–Mobility Strained–Si PMOSFET's," *IEEE Transactions on Electron Devices*, vol. 43, No. 10 (Oct. 1996), pp. 1709–1716.

O'Neill et al., "SiGe virtual substrate N–channel heterojunction MOSFETS," *Semiconductor Science and Technology*, vol. 14 (1999), pp. 784–789.

"Optimal Growth Technique and Structure for Strain Relaxation of Si–Ge Layers on Si Substrates," *IBM Technical Disclosure Bulletin*, vol. 32, No. 8A (Jan. 1990), pp. 330–331.

Papananos, "Radio–Frequency Microelectronic Circuits for Telecommunication Applications," Kluwer Academic Publishers, 1999, pp. 115–117, 188–193.

Parker et al., "SiGe heterostructure CMOS circuits and applications," *Solid State Electronics*, vol. 43 (1999), pp. 1497–1506.

Ransom et al., "Gate–Self–Aligned n–channel and p–channel Germanium MOSFET's," *IEEE Transactions on Electron Devices*, vol. 38, No. 12 (Dec. 1991), pp. 2695.

Reinking et al., "Fabrication of high–mobility Ge p–channel MOSFETs on Si substrates," *Electronics Letters*, vol. 35, No. 6 (Mar. 18, 1999), pp. 503–504.

Rim et al., "Enhanced Hole Mobilities in Surface–Channel Strained–Si p–MOSFETs," *IEDM* (1995), pp. 517–520.

Rim et al., "Fabrication and Analysis of Deep Submicron Strained–Si N–MOSFET's," *IEEE Transactions on Electron Devices*, vol. 47, No. 7 (Jul. 2000), pp. 1406–1415.

Rim, "Application of Silicon–Based Heterostructures to Enhanced Mobility Metal–Oxide–Semiconductor Field–Effect Transistors," PhD Thesis, Stanford University, 1999, pp. 1–184.

Robbins et al., "A model for heterogeneous growth of Si1–xGex films for hydrides," *Journal of Applied Physics*, vol. 69, No. 6 (Mar. 15, 1991), pp. 3729–3732.

Sadek et al., "Design of Si/SiGe Heterojunction Complementary Metal–Oxide–Semiconductor Transistors," *IEEE Transactions on Electron Devices* (Aug. 1996), pp. 1224–1232.

Schäffler, "High–Mobility Si and Ge Structures," *Semiconductor Science and Technology*, vol. 12 (1997), pp. 1515–1549.

Sugimoto et al., "A 2V, 500 MHz and 3V, 920 MHz Low–Power Current–Mode 0.6 $\mu$m CMOS VCO Circuit," *IEICE Trans Electron*, vol. E82–C, No. 7 (Jul. 1999), pp. 1327–1329.

Ternent et al., "Metal Gate Strained Silicon MOSFETs for Microwave Integrated Circuits," *IEEE* (Oct. 2000), pp. 38–43.

Tweet et al., "Factors determining the composition of strained GeSi layers grown with disilane and germane," *Applied Physics Letters*, vol. 65, No. 20 (Nov. 14, 1994), pp. 2579–2581.

Usami et al., "Spectroscopic study of Si–based quantum wells with neighboring confinement structure," *Semiconductor Science and Technology*, (1997), abstract.

Welser et al., "Electron Mobility Enhancement in Strained–Si N–Type Metal–Oxide–Semiconductor Field–Effect Transistors," *IEEE Electron Device Letters*, vol. 15, No. 3 (Mar. 1994), pp. 100–102.

Welser et al., "Evidence of Real–Space Hot–Electron Transfer in High Mobility, Strained–Si Multilayer MOSFETs," *IEEE IDEM Technical Digest* (1993 International Electron Devices Meeting), pp. 545–548.

Welser et al., "NMOS and PMOS Transistors Fabricated in Strained Silicon/Relaxed Silicon–Germanium Structures," *IEEE IDEM Technical Digest* (1992 International Electron Devices Meeting), pp. 1000–1002.

Welser, "The Application of Strained Silicon/Relaxed Silicon Germanium Heterostructures to Metal–Oxide–Semiconductor Field–Effect Transistors," PhD Thesis, Stanford University, 1994, pp. 1–205.

Wolf, et al., "Silicon Processing for the VLSI Era, vol. 1: Process Technology," Lattice Press, Sunset Beach, CA, 1986, pp. 384–386.

Xie et al., "Semiconductor Surface Roughness: Dependence on Sign and Magnitude of Bulk Strain," *The Physical Review Letters*, vol. 73, No. 22 (Nov. 28, 1994), pp. 3006–3009.

Xie et al., "Very High Mobility Two–Dimensional Hole Gas in Si/GexSi1–x/Ge Structures Grown by Molecular Beam Epitaxy," *Applied Physics Letters*, vol. 63, Issue 16 (Oct. 18, 1993), pp. 2263–2264.

Xie, "SiGe Field Effect Transistors," *Materials Science and Engineering*, vol. 25 (1999), pp. 89–121.

Yeo et al., "Nanoscale Ultra–Thin–Body Silicon–on–Insulator P–MOSFET with a SiGe/Si Heterostructure Channel," *IEEE Electron Device Letters*, vol. 21, No. 4 (Apr. 2000), pp. 161–163.

Zhang et al., "Demonstration of a GaAs–Based Compliant Substrate Using Wafer Bonding and Substrate Removal Techniques," Electronic Materials and Processing Research Laboratory, Department of Electrical Engineering, University Park, PA 16802, 1998, pp. 25–28.

"2 Bit/Cell EEPROM Cell Using Band to Band Tunneling for Data Read–Out," *IBM Technical Disclosure Bulletin*, vol. 35, No. 4B (Sep. 1992), pp. 136–140.

Grillot et al., "Acceptor diffusion and segregation in $(Al_xGa_{1-x})_{0.5}In_{0.5}P$ heterostructures," *Journal of Applied Physics*, vol. 91, No. 8 (2002), pp. 4891–4899.

Halsall et al., "Electron diffraction and Raman studies of the effect of substrate misorientation on ordering in the AlGaInP system," *Journal of Applied Physics*, vol. 85, No. 1 (1999), pp. 199–202.

Hsu et al., "Surface morphology of related $Ge_xSi_{1-x}$ films," *Appl. Phys. Lett.*, vol. 61, No. 11 (1992), pp. 1293–1295.

*IBM Technical Disclosure Bulletin*, vol. 32, No. 8A, Jan. 1990, "Optimal Growth Technique and Structure for Strain Relaxation of Si–Ge Layers on Si Substrates", pp. 330–331.

Ota, Y. et al., "Application of heterojunction FET to power amplifier for cellular telephone," *Electronics Letters*, vol. 30 No. 11 (May 26, 1994) pp. 906–907.

Sakaguchi et al., "ELTRAN® by Splitting Porous Si Layers," Proc. $195^{th}$ Int. SOI Symposium, vol. 99–3, *Electrochemical Society* (1999) pp. 117–121.

Gannavaram, et al., "Low Temperature ($\leq 800°$ C) Recessed Junction Selective Silicon–Germanium Source/Drain Technology for Sub–70 nm CMOS," *IEEE International Electron Device Meeting Technical Digest*, (2000), pp. 437–440.

Ge et al., "Process–Strained Si (PSS) CMOS Technology Featuring 3D Strain Engineering," *IEEE International Electron Devices Meeting Technical Digest*, (2003) pp. 73–76.

Ghani et al., "A 90nm High Volume Manufacturing Logic Technology Featuring Novel 45nm Gate Length Strained Silicon CMOS Transistors," *IEEE International Electron Devices Meeting Technical Digest*, (2003), 978–980.

Hamada et al., "A New Aspect of Mechanical Stress Effects in Scaled MOS Devices," *IEEE Transactions on Electron Devices*, vol. 38, No. 4 (Apr. 1991), pp. 895–900.

Huang et al., "Isolation Process Dependence of Channel Mobility in Thin–Film SOI Devices," *IEEE Electron Device Letters*, vol. 17, No. 6 (Jun. 1996), pp. 291–293.

Huang et al., "LOCOS–Induced Stress Effects on Thin–Film SOI Devices," *IEEE Transactions on Electron Devices*, vol. 44, No. 4 (Apr. 1997), pp. 646–650.

Huang, et al., "Reduction of Source/Drain Series Resistance and Its Impact on Device Performance for PMOS Transistors with Raised $Si_{1-x}Ge_x$ Source/Drain", *IEEE Electron Device Letters*, vol. 21, No. 9, (Sep. 2000) pp. 448–450.

Iida et al., "Thermal behavior of residual strain in silicon–on–insulator bonded wafer and effects on electron mobility," *Solid–State Electronics*, vol. 43 (1999), pp. 1117–1120.

Ito et al., "Mechanical Stress Effect on Etch–Stop Nitride and its Impact on Deep Submicron Transistor Design," *IEEE International Electron Devices Meeting Technical Digest* (2000), pp. 247–250.

Lochtefeld et al., "Investigating the Relationship Between Electron Mobility and Velocity in Deeply Scaled NMOS via Mechanical Stress," *IEEE Electron Device Letters*, vol. 22, No. 12 (2001), pp. 591–593.

Ootsuka et al., "A Highly Dense, High–Performance 130nm node CMOS Technology for Large Scale System–on–a–Chip Applications," *IEEE International Electron Devices Meeting Technical Digest*, (2000), pp. 575–578.

Ota et al., "Novel Locally Strained Channel Technique for High Performance 55nm CMOS," *IEEE International Electron Devices Meeting Technical Digest*, (2002), pp. 27–30.

Öztürk, et al., "Advanced $Si_{1-x}Ge_x$ Source/Drain and Contact Technologies for Sub–70 nm CMOS," *IEEE International Electron Device Meeting Technical Digest*, (2002), pp. 375–378.

Öztürk, et al., "Ultra–Shallow Source/Drain Junctions for Nanoscale CMOS Using Selective Silicon–Germanium Technology," *Extended Abstracts of International Workshop on Junction Technology*, (2001), pp. 77–82.

Öztürk, et al., "Selective Silicon–Gremanium Source/Drain Technology for Nanoscale CMOS," *Mat. Res. Soc. Symp. Proc.*, vol. 717, (2002), pp. C4.1.1–C4.1.12.

Öztürk, et al., "Low Resistivity Nickel Germanosilicide Contacts to Ultra–Shallow $Si_{1-x}Ge_x$ Source/Drain Junctions for Nanoscale CMOS," *IEEE International Electron Device Meeting Technical Digest* (2003), pp. 497–500.

Shimizu et al., "Local Mechanical–Stress Control (LMC): A New Technique for CMOS–Performance Enhancement," *IEEE International Electron Devices Meeting Technical Digest*, (2001), pp. 433–436.

Thompson et al., "A Logic Nanotechnology Featuring Strained–Silicon," *IEEE Electron Device Letters*, vol. 25, No. 4 (Apr. 2004), pp. 191–193.

Thompson et al., "A 90 nm Logic Technology Featuring 50nm Strained–Silicon Channel Transistors, 7 layers of Cu Interconnects, Low k ILD, and 1 $um^2$ SRAM Cell," *IEEE International Electron Devices Meeting Technical Digest*, (2002), pp. 61–64.

Tiwari et al., "Hole Mobility Improvement in Silicon–on–Insulator and Bulk Silicon Transistors Using Local Strain," *IEEE International Electron Devices Meeting Technical Digest*, (1997), pp. 939–941.

Uchino, et al., "A Raised Source/Drain Technology Using In–situ P–doped SiGe and B–doped Si for 0.1–$\mu$m CMOS ULSIs," *IEEE International Electron Device Meeting Technical Digest*, (1997), pp. 479–482.

* cited by examiner

| TYPE OF SURFACE | AVERAGE ROUGHNESS (nm) |
|---|---|
| AS-GROWN GRADED COMPOSITION RELAXED SiGe | 7.9 |
| PLANARIZED SiGe | 0.57 |
| REGROWTH SiGe | -0.6 |

FIG. 3

|  | n ENHANCEMENT | p ENHANCEMENT |
|---|---|---|
| $Si_{0.8}Ge_{0.2}$ | 1.75 | 1 |
| $Si_{0.7}Ge_{0.3}$ | 1.8 | 1.4 |

FIG. 6

|  | BULK SILICON | STRAINED-Si ON 20% SiGe: HIGH SPEED | STRAINED-Si ON 30% SiGe: HIGH SPEED | STRAINED-Si ON 20% SiGe: LOW POWER | STRAINED-Si ON 30% SiGe: LOW POWER |
|---|---|---|---|---|---|
| n ENHANCEMENT | 1 | 1.75 | 1.8 | 1.75 | 1.8 |
| p ENHANCEMENT | 1 | 1 | 1.4 | 1 | 1.4 |
| $W_p$ (μm) | 5.4 | 5.4 | 5.4 | 5.4 | 5.4 |
| $W_n$ (μm) | 1.8 | 1.8 | 1.8 | 1.8 | 1.8 |
| $L_n, L_p$ (μm) | 1.2 | 1.2 | 1.2 | 1.2 | 1.2 |
| $C_L$ (fF) | 32 | 32 | 32 | 32 | 32 |
| $V_{DD}$ (V) | 5 | 4.7 | 4.4 | 4.3 | 3.8 |
| $NM_H$ (V) | 2.053 | 2.218 | 1.949 | 2.037 | 1.682 |
| $NM_L$ (V) | 2.067 | 1.654 | 1.721 | 1.542 | 1.504 |
| $t_{pHL}$ (psec) | 211.3 | 133.7 | 141.6 | 152.2 | 180.1 |
| $t_{pLH}$ (psec) | 195.8 | 220.0 | 173.3 | 254.8 | 226.9 |
| $t_p$ (psec) | 203.5 | 176.9 | 157.4 | 203.5 | 203.5 |
| POWER (mW) | 3.93 | 3.93 | 3.93 | 2.87 | 2.21 |
| % SPEED INCREASE | - | 15.1% | 29.3% | - | - |
| % POWER REDUCTION | - | - | - | 27.0% | 43.7% |

FIG. 7

| | BULK SILICON | STRAINED-Si ON 20% SiGe: CONSTANT $V_{DD}$ | STRAINED-Si ON 30% SiGe: CONSTANT $V_{DD}$ | STRAINED-Si ON 20% SiGe: HIGH SPEED SYMMETRICAL INVERTER | STRAINED-Si ON 30% SiGe: HIGH SPEED SYMMETRICAL INVERTER | STRAINED-Si ON 20% SiGe: LOW POWER SYMMETRICAL INVERTER | STRAINED-Si ON 30% SiGe: LOW POWER SYMMETRICAL INVERTER |
|---|---|---|---|---|---|---|---|
| n ENHANCEMENT | 1 | 1.75 | 1.8 | 1.75 | 1.8 | 1.75 | 1.8 |
| p ENHANCEMENT | 1 | 1 | 1.4 | 1 | 1.4 | 1 | 1.4 |
| $W_p$ (μm) | 5.4 | 5.4 | 5.4 | 9.45 | 6.94 | 9.45 | 6.94 |
| $W_n$ (μm) | 1.8 | 1.8 | 1.8 | 1.8 | 1.8 | 1.8 | 1.8 |
| $L_n, L_p$ (μm) | 1.2 | 1.2 | 1.2 | 1.2 | 1.2 | 1.2 | 1.2 |
| $C_L$ (fF) | 32 | 32 | 32 | 32 | 32 | 32 | 32 |
| $V_{DD}$ (V) | 5 | 5 | 5 | 4.3 | 4.2 | 3.5 | 3.5 |
| $NM_H$ (V) | 2.053 | 2.376 | 2.198 | 1.782 | 1.770 | 1.5018 | 1.4796 |
| $NM_L$ (V) | 2.067 | 1.751 | 1.923 | 1.794 | 1.781 | 1.5101 | 1.4876 |
| $t_{pHL}$ (psec) | 211.3 | 120.7 | 117.4 | 152.0 | 149.5 | 204.4 | 204.1 |
| $t_{pLH}$ (psec) | 195.8 | 195.8 | 139.9 | 145.4 | 143.3 | 202.6 | 202.9 |
| $t_p$ (psec) | 203.5 | 158.3 | 128.6 | 148.7 | 146.4 | 203.5 | 203.5 |
| POWER (mW) | 3.93 | 5.06 | 6.22 | 3.93 | 3.93 | 1.95 | 1.89 |
| % SPEED INCREASE | - | 28.6% | 58.3% | 36.9% | 39.0% | - | - |
| % POWER REDUCTION | - | - | - | - | - | 50.4% | 52.0% |

FIG. 8

|  | BULK SILICON | STRAINED-Si ON 20% SiGe: HIGH SPEED | STRAINED-Si ON 30% SiGe: HIGH SPEED | STRAINED-Si ON 20% SiGe: LOW POWER | STRAINED-Si ON 30% SiGe: LOW POWER |
|---|---|---|---|---|---|
| n ENHANCEMENT | 1 | 1.75 | 1.8 | 1.75 | 1.8 |
| p ENHANCEMENT | 1 | 1 | 1.4 | 1 | 1.4 |
| $W_p$ (μm) | 3.11 | 4.12 | 3.53 | 4.12 | 3.53 |
| $W_n$ (μm) | 1.8 | 1.8 | 1.8 | 1.8 | 1.8 |
| $L_n, L_p$ (μm) | 1.2 | 1.2 | 1.2 | 1.2 | 1.2 |
| $C_L$ (fF) | 22.5 | 26.7 | 24.2 | 26.7 | 24.2 |
| $V_{DD}$ (V) | 5 | 4.5 | 4.3 | 4.4 | 3.8 |
| $NM_H$ (V) | 2.370 | 2.275 | 2.123 | 2.220 | 1.872 |
| $NM_L$ (V) | 1.756 | 1.485 | 1.511 | 1.458 | 1.371 |
| $t_{pHL}$ (psec) | 148.4 | 117.3 | 109.3 | 121.5 | 132.4 |
| $t_{pLH}$ (psec) | 238.5 | 254.8 | 204.9 | 265.3 | 254.4 |
| $t_p$ (psec) | 193.4 | 186.0 | 157.1 | 193.4 | 193.4 |
| POWER (mW) | 2.90 | 2.90 | 2.90 | 2.66 | 1.83 |
| % SPEED INCREASE | - | 4.0% | 23.1% | - | - |
| % POWER REDUCTION | - | - | - | 8.4% | 37.1% |

FIG. 9

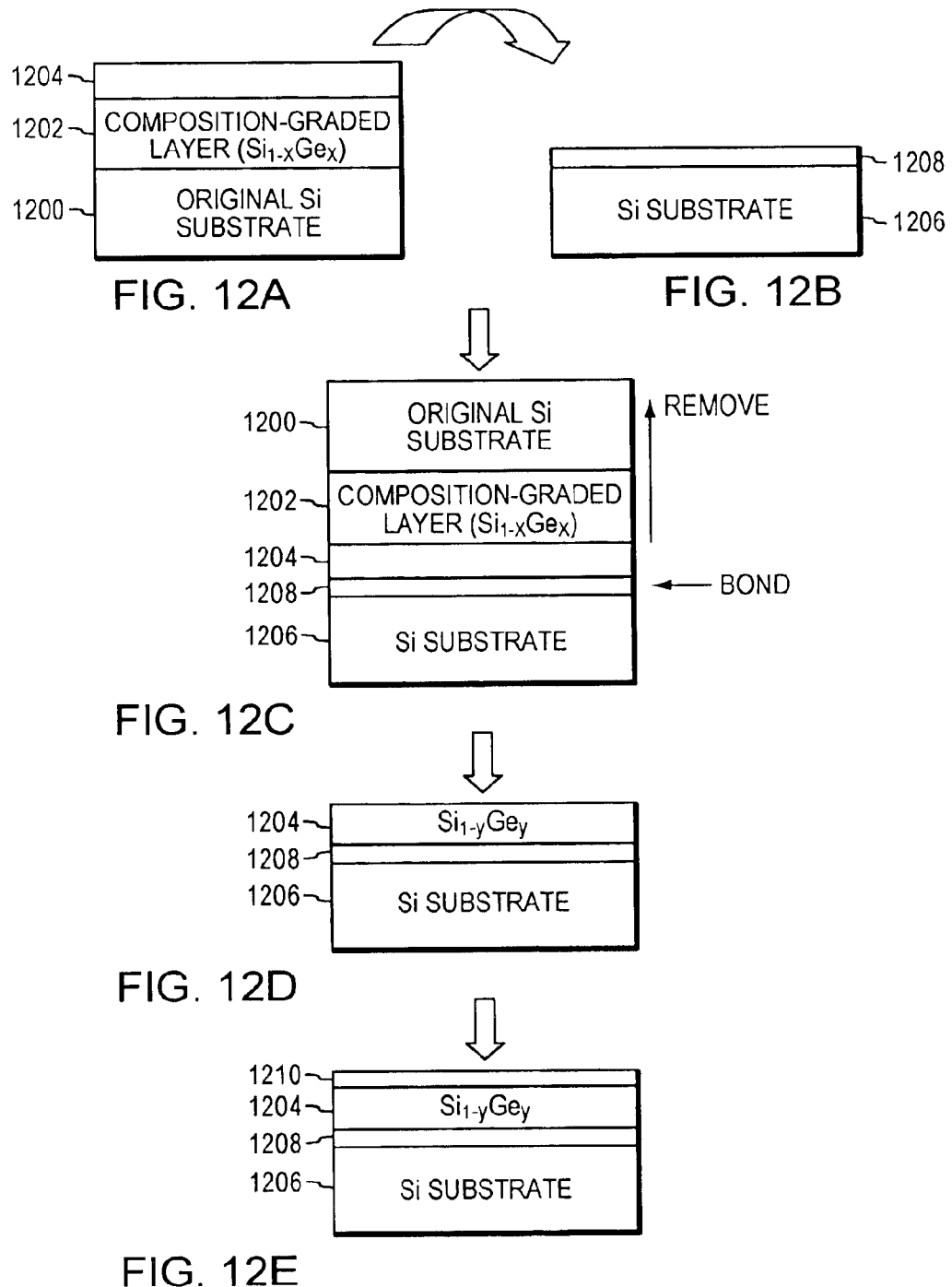

METHOD OF FABRICATING CMOS INVERTER AND INTEGRATED CIRCUITS UTILIZING STRAINED SURFACE CHANNEL MOSFETS

PRIORITY INFORMATION

This is a continuation of U.S. Ser. No. 09/884,172, filed on Jun. 19, 2001, now U.S. Pat. No. 6,649,480, and which claims priority from provisional application Ser. No. 60/250, 985, filed Dec. 4, 2000.

BACKGROUND OF THE INVENTION

The invention relates to the field of strained silicon surface channel MOSFETs, and in particular to using them in CMOS inverters and other integrated circuits.

The ability to scale CMOS devices to smaller and smaller dimensions has enabled integrated circuit technology to experience continuous performance enhancement. Since the 1970's, gate lengths have decreased by two orders of magnitude, resulting in a 30% improvement in the price/performance per year. Historically, these gains have been dictated by the advancement of optical photolithography tools and photoresist materials. As CMOS device size progresses deeper and deeper into the sub-micron regime, the associated cost of these new tools and materials can be prohibitive. A state of the art CMOS facility can cost more than 1–2 billion dollars, a daunting figure considering that the lithography equipment is generally only useful for two scaling generations.

In addition to economic constraints, scaling is quickly approaching constraints of device materials and design. Fundamental physical limits such as gate oxide leakage and source/drain extension resistance make continued minimization beyond 0.1 $\mu$m difficult if not impossible to maintain. New materials such as high k dielectrics and metal gate electrodes must be introduced in order to sustain the current roadmap until 2005. Beyond 2005, the fate of scaling is unclear.

Since the limits of scaling are well within sight, researchers have actively sought other methods of increasing device performance. One alternative is to make heterostructure FETs in GaAs/AlGaAs in order to take advantage of the high electron mobilities in these materials. However, the high electron mobility in GaAs is partially offset by the low hole mobility, causing a problem for complementary FET architectures. In addition, GaAs devices are usually fabricated with Schottky gates. Schottky diodes have leakage currents that are orders of magnitudes higher than MOS structures. The excess leakage causes an increase in the off-state power consumption that is unacceptable for highly functional circuits. Schottky diodes also lack the self-aligned gate technology enjoyed by MOS structures and thus typically have larger gate-to-source and gate-to-drain resistances. Finally, GaAs processing does not enjoy the same economies of scale that have caused silicon technologies to thrive. As a result, wide-scale production of GaAs circuits would be extremely costly to implement.

The most popular method to increase device speed at a constant gate length is to fabricate devices on silicon-on-insulator (SOI) substrates. In an SOI device, a buried oxide layer prevents the channel from fully depleting. Partially depleted devices offer improvements in the junction area capacitance, the device body effect, and the gate-to-body coupling. In the best-case scenario, these device improvements will result in an 18% enhancement in circuit speed.

However, this improved performance comes at a cost. The partially depleted floating body causes an uncontrolled lowering of the threshold voltage, known as the floating body effect. This phenomenon increases the off-state leakage of the transistor and thus offsets some of the potential performance advantages. Circuit designers must extract enhancements through design changes at the architectural level. This redesign can be costly and thus is not economically advantageous for all Si CMOS products. Furthermore, the reduced junction capacitance of SOI devices is less important for high functionality circuits where the interconnect capacitance is dominant. As a result, the enhancement offered by SOI devices is limited in its scope.

Researchers have also investigated the mobility enhancement in strained silicon as a method to improve CMOS performance. To date, efforts have focused on circuits that employ a buried channel device for the PMOS, and a surface channel device for the NMOS. This method provides the maximum mobility enhancement; however, at high fields the buried channel device performance is complex due to the activation of two carrier channels. In addition, monolithic buried and surface channel CMOS fabrication is more complex than bulk silicon processing. This complexity adds to processing costs and reduces the device yield.

SUMMARY OF THE INVENTION

In accordance with the invention, the performance of a silicon CMOS inverter by increasing the electron and hole mobilities is enhanced. This enhancement is achieved through surface channel, strained-silicon epitaxy on an engineered SiGe/Si substrate. Both the n-type and p-type channels (NMOS and PMOS) are surface channel, enhancement mode devices. The technique allows inverter performance to be improved at a constant gate length without adding complexity to circuit fabrication or design.

When silicon is placed under tension, the degeneracy of the conduction band splits forcing two valleys to be occupied instead of six. As a result, the in-plane, room temperature electron mobility is dramatically increased, reaching a value as high as 2900 $cm^2$/V-sec in buried channel devices for electrons densities of $10^{11}-10^{12}$ $cm^{-2}$. Mobility enhancement can be incorporated into a MOS device through the structure of the invention. In the structure, a compositionally graded buffer layer is used to accommodate the lattice mismatch between a relaxed SiGe film and a Si substrate. By spreading the lattice mismatch over a distance, the graded buffer minimizes the number of dislocations reaching the surface and thus provides a method for growing high-quality relaxed SiGe films on Si. Subsequently, a silicon film below the critical thickness can be grown on the SiGe film. Since the lattice constant of SiGe is larger than that of Si, the Si film is under biaxial tension and thus the carriers exhibit strain-enhanced mobilities.

There are two primary methods of extracting performance enhancement from the increased carrier mobility. First, the frequency of operation can be increased while keeping the power constant. The propagation delay of an inverter is inversely proportional to the carrier mobility. Thus, if the carrier mobility is increased, the propagation delay decreases, causing the overall device speed to increase. This scenario is useful for applications such as desktop computers where the speed is more crucial than the power consumption. Second, the power consumption can be decreased at a constant frequency of operation. When the carrier mobility increases, the gate voltage can be reduced by an inverse fraction while maintaining the same inverter speed. Since power is proportional to the square of the gate voltage, this reduction results in a significant decrease in the power consumption. This situation is most useful for portable applications that operate off of a limited power supply.

Unlike GaAs high mobility technologies, strained silicon devices can be fabricated with standard silicon CMOS processing methods and tools. This compatibility allows for performance enhancement with no additional capital expenditures. The technology is also scalable and thus can be implemented in both long and short channel devices. The physical mechanism behind short channel mobility enhancement is not completely understood; however it has been witnessed and thus can be used to improve device performance. Furthermore, if desired, strained silicon can be incorporated with SOI technology in order to provide ultrahigh speed/low power circuits. In summary, since strained silicon technology is similar to bulk silicon technology, it is not exclusive to other enhancement methods. As a result, strained silicon is an excellent technique for CMOS performance improvement.

BRIEF DESCRIPTION OF THE DRAWINGS

FIG. 3 is a table that displays surface roughness data for various relaxed SiGe buffers on Si substrates;

FIG. 6 is a table showing electron and hole mobility enhancements measured for strained silicon on 20% and 30% SiGe;

FIG. 7 is a table showing inverter characteristics for 1.2 $\mu$m CMOS fabricated in both bulk and strained silicon when the interconnect capacitance is dominant;

FIG. 8 is a table showing additional scenarios for strained silicon inverters when the interconnect capacitance is dominant;

FIG. 9 is a table showing inverter characteristics for 1.2 $\mu$m CMOS fabricated in both bulk and strained silicon when the device capacitance is dominant;

FIGS. 12A–12E show a fabrication process sequence for strained silicon on SOI substrates.

DETAILED DESCRIPTION OF THE INVENTION

Strained Silicon Enhancement

Figure 1:
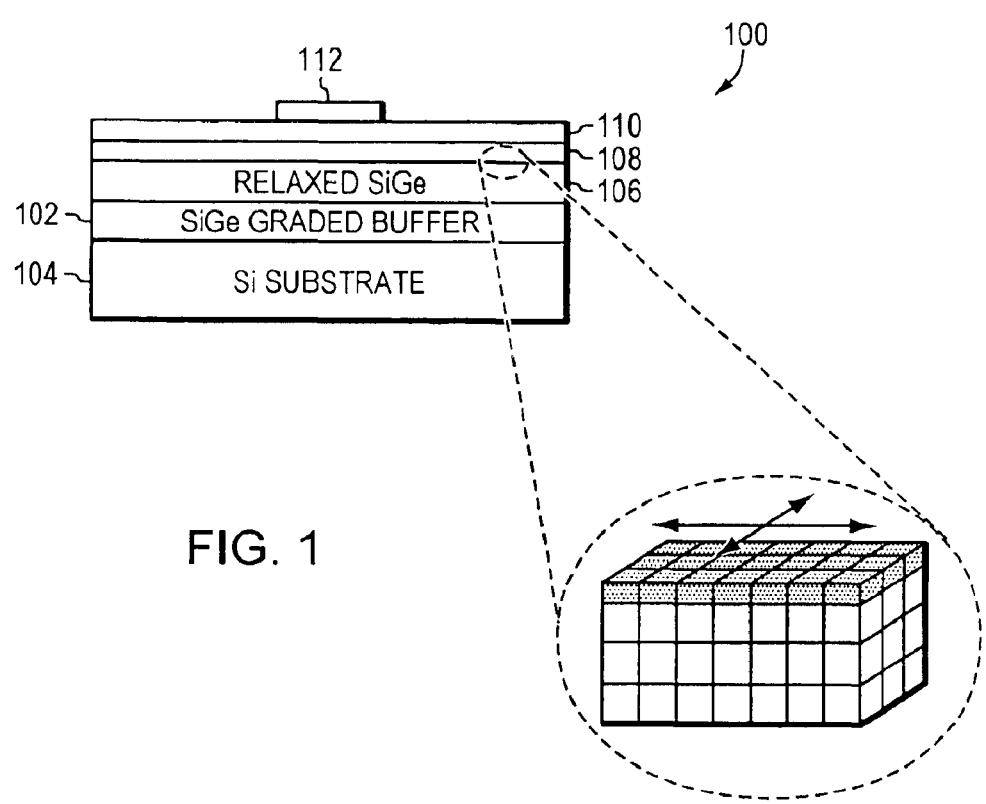
FIG. 1 is a cross-section of the substrate structure required to produce a strained silicon surface channel MOSFET.

FIG. 1 is a cross-section of the substrate structure 100 required to produce a strained silicon surface channel MOSFET. The larger lattice constant, relaxed SiGe layer applies biaxial strain to the silicon surface layer. In this structure, a compositionally graded buffer layer 102 is used to accommodate the lattice mismatch between a relaxed SiGe film 106 and a Si substrate 104. By spreading the lattice mismatch over a distance, the graded buffer minimizes the number of dislocations reaching the surface and thus provides a method for growing high-quality relaxed SiGe films on Si. Subsequently, a silicon film 108 below the critical thickness can be grown on the SiGe film. Since the lattice constant of SiGe is larger than that of Si, the Si film is under biaxial tension and thus the carriers exhibit strain-enhanced mobilities. Thereafter, a layer 110 of $SiO_2$ and a gate 112 are provided thereon.

In the structure shown in FIG. 1, the silicon channel is placed under biaxial tension by the underlying, larger lattice constant SiGe layer. This strain causes the conduction band to split into two-fold and four-fold degenerate bands. The two-fold band is preferentially occupied since it sits at a lower energy. The energy separation between the bands is approximately:

$$\Delta E_{strain}=0.67 \cdot x (eV) \quad (1)$$

where x is equal to the Ge content in the SiGe layer. The equation shows that the band splitting increases as the Ge content increases. This splitting causes mobility enhancement by two mechanisms. First, the two-fold band has a lower effective mass, and thus higher mobility than the four-fold band. Therefore, as the higher mobility band becomes energetically preferred, the average carrier mobility increases. Second, since the carriers are occupying two orbitals instead of six, inter-valley phonon scattering is reduced, further enhancing the carrier mobility.

Figure 2A:
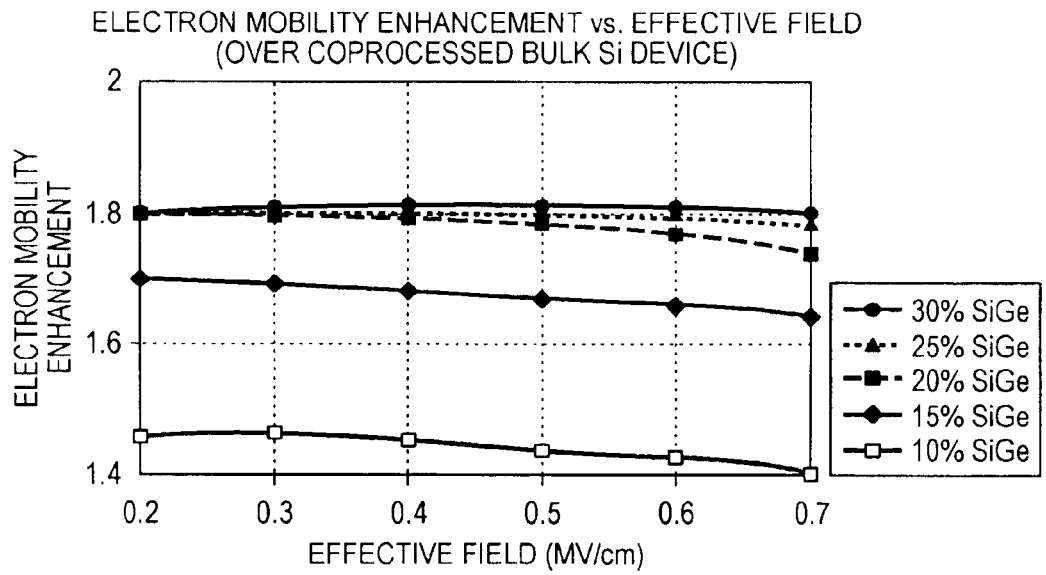
FIGS. 2A and 2B are graphs of mobility enhancements for electrons and holes, respectively, for strained silicon on $Si_{1-x}Ge_x$ for x=10–30%.
Figure 2B:
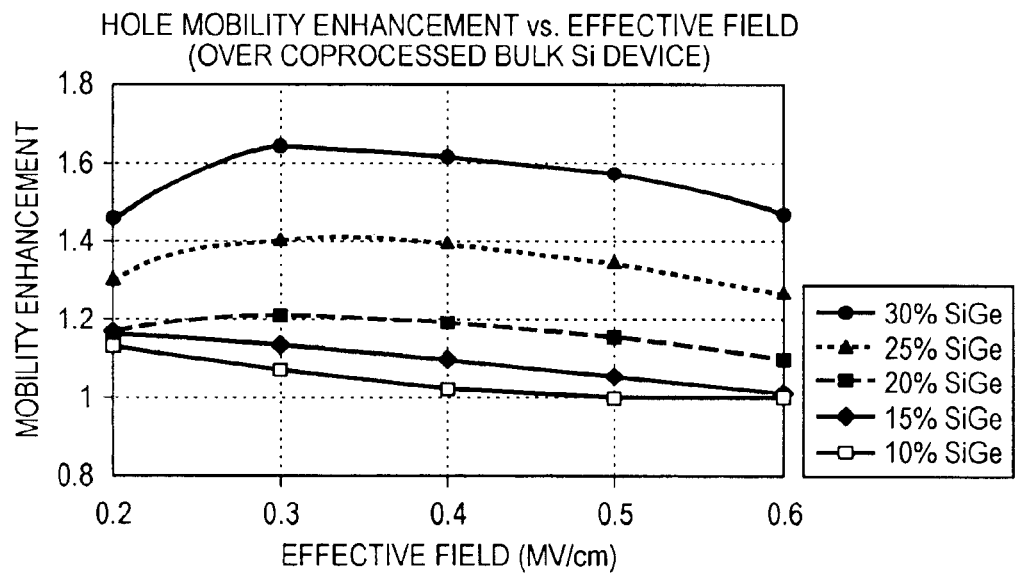

The effects of Ge concentration on electron and hole mobility for a surface channel device can be seen in FIGS. 2A and 2B, respectively. FIGS. 2A and 2B are graphs of mobility enhancements for electrons and holes, respectively, for strained silicon on $Si_{1-x}Ge_x$ for x=10–30%. At 20% Ge, the electron enhancement at high fields is approximately 1.75 while the hole enhancement is essentially negligible. Above approximately 20% Ge, the electron enhancement saturates. This saturation occurs because the conduction band splitting is large enough that almost all of the electrons occupy the high mobility band. Hole enhancement saturation has not yet been observed; therefore, raising the Ge concentration to 30% increases hole mobility by a factor of 1.4. Hole enhancement saturation is predicted to occur at a Ge concentration of about 40%.

The low hole mobility in surface channel devices has caused other researchers to move to higher mobility, buried channel devices for the PMOSFET. Here, it is shown that significant CMOS enhancement can be achieved using surface channel devices for both NMOS and PMOS. This design allows for high performance without the complications of dual channel operation and without adding complexity to circuit fabrication.

Until recently; the material quality of relaxed SiGe on Si was insufficient for utilization in CMOS fabrication. During epitaxial growth, the surface of the SiGe becomes very rough as the material is relaxed via dislocation introduction. Researchers have tried to intrinsically control the surface morphology through the growth; however, since the stress fields from the misfit dislocations affect the growth front, no intrinsic epitaxial solution is possible. U.S. Pat. No. 6,107, 653 issued to Fitzgerald, incorporated herein by reference, describes a method of planarization and regrowth that allows all devices on relaxed SiGe to possess a significantly flatter surface. This reduction in surface roughness is critical in the production of strained Si CMOS devices since it increases the yield for fine-line lithography.

FIG. 3 is a table that displays surface roughness data for various relaxed SiGe buffers on Si substrates. It will be appreciated that the as-grown crosshatch pattern for relaxed $Si_{0.8}Ge_{0.2}$ buffers creates a typical roughness of approximately 7.9 nm. This average roughness increases as the Ge content in the relaxed buffer is increased. Thus, for any relaxed SiGe layer that is relaxed through dislocation introduction during growth, the surface roughness is unacceptable for state-of-the-art fabrication facilities. After the relaxed SiGe is planarized, the average roughness is less than 1 nm (typically 0.57 nm), and after a 1.5 μm device layer deposition, the average roughness is 0.77 nm. Therefore, after the complete structure is fabricated, there is over an order of magnitude reduction in the surface roughness. The resulting high quality material is well suited for state of the art CMOS processing.

CMOS Inverter

Figure 4:
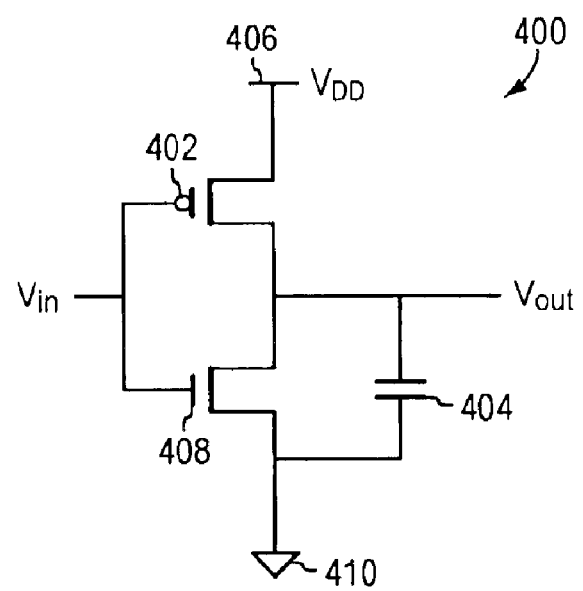
FIG. 4 is a schematic diagram of a CMOS inverter.

FIG. 4 is a schematic diagram of a CMOS inverter 400. When the input voltage, $V_{in}$, to the inverter is low, a PMOS transistor 402 turns on, charges up a load capacitance 404, and the output goes to a gate drive 406, $V_{DD}$. Alternatively, when $V_{in}$ is high, an NMOS transistor 408 turns on, discharges the load capacitance, and the output node goes to ground 410. In this manner, the inverter is able to perform the logic swing necessary for digital processing. The load capacitance, denoted as $C_L$, represents a lumped model of all of the capacitances between $V_{out}$ and ground.

Since the load capacitance must be fully charged or discharged before the logic swing is complete, the magnitude of $C_L$ has a large impact on inverter performance. The performance is usually quantified by two variables: the propagation delay, $t_p$, and the power consumed, P. The propagation delay is defined as how quickly a gate responds to a change in its input and is given by:

$$t_p = \frac{C_L \cdot V_{DD}}{I_{av}} \quad (2)$$

where $I_{av}$ is the average current during the voltage transition. There is a propagation delay term associated with the NMOS discharging current, $t_{pHL}$, and a term associated with the PMOS charging current, $t_{pLH}$. The average of these two values represents the overall inverter delay:

$$t_p = \frac{t_{pHL} + t_{pLH}}{2} \quad (3)$$

Assuming that static and short-circuit power are negligible, the power consumed can be written as:

$$P = \frac{C_L \cdot V_{DD}^2}{t_p} \quad (4)$$

From equations 2 and 4, one can see that both the propagation delay and the power consumption have a linear dependence on the load capacitance. In an inverter, $C_L$ consists of two major components: interconnect capacitance and device capacitance. Which component dominates $C_L$ depends on the architecture of the circuit in question.

Strained Silicon, Long Channel CMOS Inverter

Figure 5A:
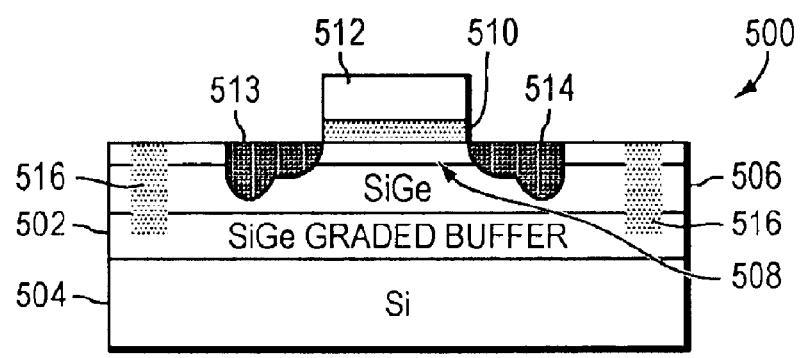
FIGS. 5A and 5B are schematic diagrams of the structures of a strained silicon MOSFET 500 and a strained silicon MOSFET 550 on SOI, respectively.
Figure 5B:
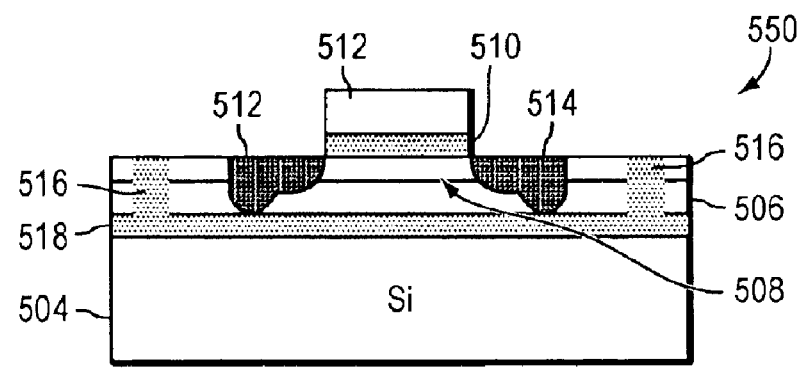

FIGS. 5A and 5B are schematic diagrams of the structures of a strained silicon MOSFET 500 and a strained silicon MOSFET 550 on SOI, respectively. The structure in FIG. 5A contains the elements shown in the substrate structure of FIG. 1 along with basic elements of the MOSFET device structure, i.e. source 513 and drain 514 regions, gate oxide 510 and gate 512 layers, and device isolation regions 516. FIG. 5B shows the same device elements on a SiGe-on-insulator (SGOI) substrate. In the SGOI substrate, a buried oxide layer 518 separates the relaxed SiGe layer 506 from the underlying Si substrate 504. In both MOSFET structures, the strained Si layer 508 serves as the carrier channel, thus enabling improved device performance over their bulk Si counterparts.

When strained silicon is used as the carrier channel, the electron and hole mobilities are multiplied by enhancement factors. FIGS. 2A and 2B demonstrate that this enhancement differs for electrons and holes and also that it varies with the Ge fraction in the underlying SiGe layer.

A summary of the enhancements for $Si_{0.8}Ge_{0.2}$ and $Si_{0.7}Ge_{0.3}$ is shown in FIG. 6. FIG. 6 is a table showing electron and hole mobility enhancements measured for strained silicon on 20% and 30% SiGe. These enhancements are incorporated into 1.2 μm CMOS models in order to quantify the effects on inverter performance. The mobility enhancement can be capitalized upon in two primary ways: 1) increase the inverter speed at a constant power and 2) reduce the inverter power at a constant speed. These two optimization methods are investigated for both a wiring capacitance dominated case and a device capacitance dominated case.

Interconnect Dominated Capacitance

In high performance microprocessors, the interconnect or wiring capacitance is often dominant over the device capacitance. In this scenario, standard silicon PMOS devices are made two to three times wider than their NMOS counterparts. This factor comes from the ratio of the electron and hole mobilities in bulk silicon. If the devices were of equal width, the low hole mobility would cause the PMOS device to have an average current two to three times lower than the NMOS device. Equation 2 shows that this low current would result in a high $t_{pLH}$ and thus cause a large gate delay. Increasing the width of the PMOS device equates the high-to-low and low-to-high propagation delays and thus creates a symmetrical, high-speed inverter.

Key values for a bulk silicon, 1.2 μm symmetrical inverter are shown in FIG. 7. FIG. 7 is a table showing inverter characteristics for 1.2 μm CMOS fabricated in both bulk and strained silicon when the interconnect capacitance is dominant. The strained silicon inverters are optimized to provide high speed at constant power and low power at constant speed. The propagation delay for the bulk silicon inverter is 204 psec and the consumed power is 3.93 mW. In an application where speed is paramount, such as in desktop computing, strained silicon provides a good way to enhance the circuit speed. Assuming no change from the bulk silicon design, a strained silicon inverter on $Si_{0.8}Ge_{0.2}$ results in a 15% speed increase at constant power. When the channel is on $Si_{0.7}Ge_{0.3}$, the speed enhancement improves to 29% (FIG. 7).

The improvement in inverter speed expected with one generation of scaling is approximately 15% (assumes an 11% reduction in feature size). Thus, the speed enhancement provided by a strained silicon inverter on 20% SiGe is equal to one scaling generation, while the speed enhancement provided by 30% SiGe is equivalent to two scaling generations.

Alternatively, reducing the gate drive, $V_{DD}$, can reduce the power at a constant speed. For 20% SiGe, the power consumption is 27% lower than its bulk silicon counterpart. When 30% SiGe is used, the power is reduced by 44% from the bulk silicon value (FIG. 7). This power reduction is important for portable computing applications such as laptops and handhelds.

Equation 4 shows that if $C_L$ is constant and $t_p$ is reduced, $V_{DD}$ must decrease to maintain the same inverter power. If the power consumption is not critical, the inverter frequency can be maximized by employing strained silicon devices at the same $V_{DD}$ as bulk Si devices. As described heretofore above, in a constant power scenario, the inverter speed is increased 15% for Si on $Si_{0.8}Ge_{0.2}$ and 29% for Si on $Si_{0.7}Ge_{0.3}$. When $V_{DD}$ is held constant, this enhancement increases to 29% and 58%, for Si on $Si_{0.8}Ge_{0.2}$ and $Si_{0.7}Ge_{0.3}$, respectively. FIG. 8 is a table showing additional scenarios for strained silicon inverters on 20% and 30% SiGe when the interconnect capacitance is dominant. Parameters are given for 1) strained silicon inverters with the same $V_{DD}$ as comparable bulk silicon inverters 2) symmetrical strained silicon inverters—designed for high speed and 3) symmetrical strained silicon inverters designed for low power.

One drawback of strained silicon, surface channel CMOS is that the electron and hole mobilities are unbalanced further by the uneven electron and hole enhancements. This unbalance in mobility translates to an unbalance in the noise margins of the inverter. The noise margins represent the allowable variability in the high and low inputs to the inverter. In bulk silicon microprocessors, both the low and high noise margins are about 2.06 V. For strained silicon on 20% and 30% SiGe, the low noise margin, $NM_L$, is decreased to 1.65 V and 1.72 V, respectively. While the $NM_L$ is reduced, the associated $NM_H$ is increased. Therefore, if the high input is noisier than the low input, the asymmetric noise margins may be acceptable or even desired.

However, if a symmetrical inverter is required, the PMOS device width must be increased to $\mu_n/\mu_p$ times the NMOS device width. This translates to a 75% increase in PMOS width for $Si_{0.8}Ge_{0.2}$, and a 29% increase for $S_{0.7}Ge_{0.3}$. If the circuit capacitance is dominated by interconnects, the increased device area will not cause a significant increase in $C_L$. As a result, if the increased area is acceptable for the intended application, inverter performance can be further enhanced. In the constant power scenario, the speed can now be increased by 37% for $Si_{0.8}Ge_{0.2}$ and by 39% for $Si_{0.7}Ge_{0.3}$. When the power is reduced for a constant frequency, a 50% and 52% reduction in consumed power is possible with 20% and 30% SiGe, respectively (FIG. 8). However, in many applications an increase in device area is not tolerable. In these situations if inverter symmetry is required, it is best to use strained silicon on 30% SiGe. Since the electron and hole enhancement is comparable on $Si_{0.7}Ge_{0.3}$, it is easier to trade-off size for symmetry to meet the needs of the application.

Non-Interconnect Dominant Capacitance

The device capacitance is dominant over the wiring capacitance in many analog applications. The device capacitance includes the diffusion and gate capacitance of the inverter itself as well as all inverters connected to the gate output, known as the fan-out. Since the capacitance of a device depends on its area, PMOS upsizing results in an increase in $C_L$. If inverter symmetry is not a prime concern, reducing the PMOS device size can increase the inverter speed. This PMOS downsizing has a negative effect on $t_{pLH}$ but has a positive effect on $t_{pHL}$. The optimum speed is achieved when the ratio between PMOS and NMOS widths is set to $\sqrt{\mu_n/\mu_p}$, where $\mu_n$ and $\mu_p$ represent the electron and hole mobilities, respectively. The optimized design has a propagation delay as much as 5% lower than the symmetrical design. The down side is that making $t_{pLH}$ and $t_{pHL}$ unbalanced reduces the low noise margin by approximately 15%. In most designs, this reduced $NM_L$ is still acceptable.

FIG. 9 is a table showing inverter characteristics for 1.2 $\mu$m CMOS fabricated in both bulk and strained silicon when the device capacitance is dominant. The strained silicon inverters are optimized to provide high speed at constant power and low power at constant speed. For strained silicon on $Si_{0.8}Ge_{0.2}$, the electron mobility is a factor of 5.25 higher than the hole mobility. When the PMOS width is re-optimized to accommodate these mobilities, i.e., by using the $\sqrt{\mu_n/\mu_p}$ optimization, the strained silicon PMOS device on $Si_{0.8}Ge_{0.2}$ is over 30% wider than the bulk Si PMOS device.

The resulting increase in capacitance offsets some of the advantages of the enhanced mobility. Therefore, only a 4% speed increase occurs at constant power, and only an 8% decrease in power occurs at constant speed (FIG. 9). Although these improvements are significant, they represent a fraction of the performance improvement seen with a generation of scaling and do not surpass the performance capabilities available with SOI architectures.

In contrast, strained silicon on $Si_{0.7}Ge_{0.3}$ offers a significant performance enhancement at constant gate length for circuits designed to the $\sqrt{\mu_n/\mu_p}$ optimization. Since the electron and hole mobilities are more balanced, the effect on the load capacitance is less substantial. As a result, large performance gains can be achieved. At constant power, the inverter speed can be increased by over 23% and at constant speed, the power can be reduced by over 37% (FIG. 9). The latter enhancement has large implications for portable analog applications such as wireless communications.

As in the microprocessor case (interconnect dominated), the strained silicon devices suffer from small low noise margins. Once again, this effect can be minimized by using 30% SiGe. If larger margins are required, the PMOS device width can be increased to provide the required symmetry. However, this PMOS upsizing increases $C_L$ and thus causes an associated reduction in performance. Inverter design must be tuned to meet the specific needs of the intended application.

Short Channel CMOS Inverter

Figure 10:
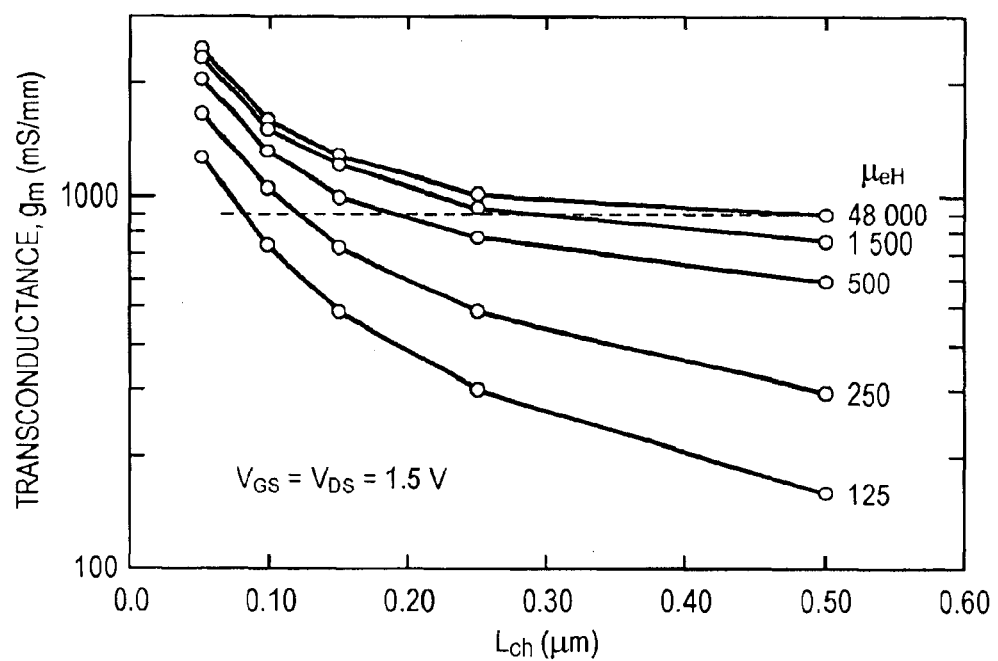
FIG. 10 is a graph showing NMOSFET transconductance versus channel length for various carrier mobilities.

In short channel devices, the lateral electric field driving the current from the source to the drain becomes very high. As a result, the electron velocity approaches a limiting value called the saturation velocity, $v_{sat}$. Since strained silicon provides only a small enhancement in $v_{sat}$ over bulk silicon, researchers believed that strained silicon would not provide a performance enhancement in short channel devices. However, recent data shows that transconductance values in short channel devices exceed the maximum value predicted by velocity saturation theories. FIG. 10 is a graph showing NMOSFET transconductance versus channel length for various carrier mobilities. The dashed line indicates the maximum transconductance predicted by velocity saturation theories. The graph shows that high low-field mobilities translate to high high-field mobilities. The physical mechanism for this phenomenon is still not completely understood; however, it demonstrates that short channel mobility enhancement can occur in strained silicon.

The power consumed in an inverter depends on both $V_{DD}$ and $t_p$ (equation 4). Therefore, as $t_p$ is decreased due to mobility enhancement, $V_{DD}$ must also be decreased in order to maintain the same power consumption. In a long channel device, the average current, $I_{av}$, is proportional to $V_{DD}^2$. Inserting this dependence into equation 2 reveals an inverse dependence of the propagation delay on $V_{DD}$. Thus, as the average current in strained silicon is increased due to mobility enhancement, the effect on the propagation delay is somewhat offset by the reduction in $V_{DD}$.

A comparison of the high-speed scenario in FIG. 7 to the constant $V_{DD}$ scenario in FIG. 8 reveals the effect the reduced $V_{DD}$ has on speed enhancement. In a short channel device, the average current is proportional to $V_{DD}$ not $V_{DD}^2$, causing the propagation delay to have no dependence on $V_{DD}$ (assuming $V_{DD} \gg V_T$). As a result, mobility enhancements in a short channel, strained silicon inverter are directly transferred to a reduction in $t_p$. A 1.2 μm strained silicon inverter on 30% SiGe experiences a 29% increase in device speed for the same power. Assuming the same levels of enhancement, a short channel device experiences a 58% increase in device speed for constant power, double the enhancement seen in the long channel device.

Figure 11:
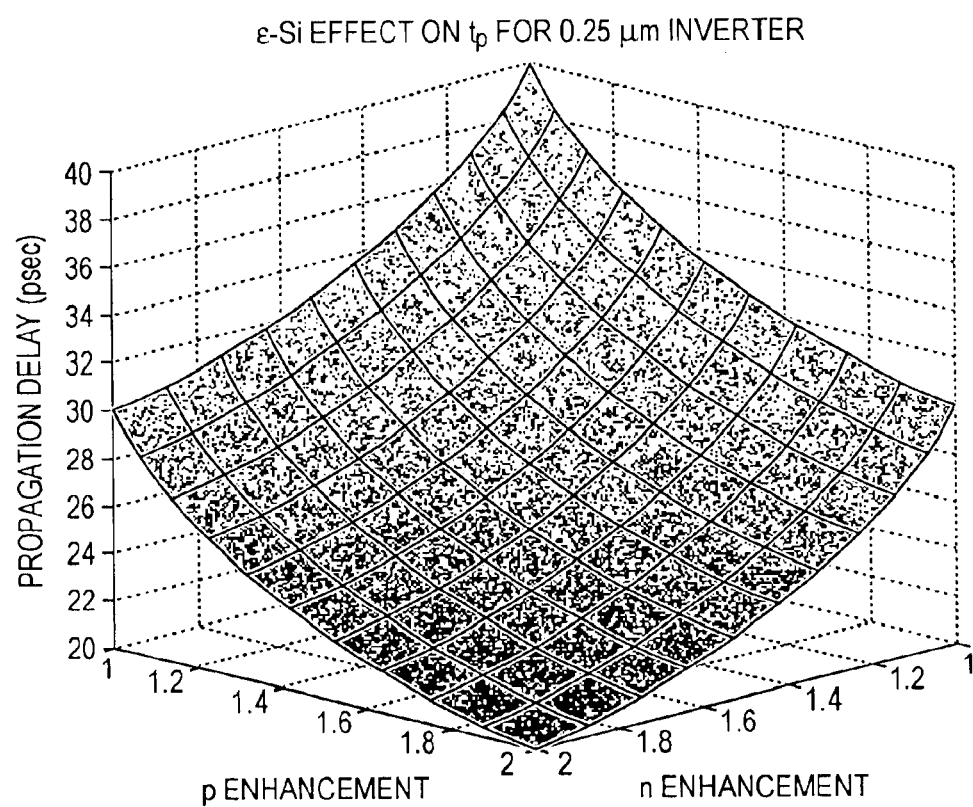
FIG. 11 is a graph showing the propagation delay of a 0.25 $\mu$m CMOS inverter for a range of electron and hole mobility enhancements.

FIG. 11 is a graph showing the propagation delay of a 0.25 μm CMOS inverter for a range of electron and hole mobility enhancements. Although the exact enhancements in a short channel device vary with the fabrication processes, FIG. 11 demonstrates that even small enhancements can result in a significant effect on $t_p$.

Strained Silicon on SOI

Strained silicon technology can also be incorporated with SOI technology for added performance benefits. FIGS. 12A–12E show a fabrication process sequence for strained silicon on SOI substrates. First, a SiGe graded buffer layer 1202 is grown on a silicon substrate 1200 with a uniform relaxed SiGe cap layer 1204 of the desired concentration (FIG. 12A). This wafer is then bonded to a silicon wafer 1206 oxidized with a $SiO_2$ layer 1208 (FIGS. 12B–12C). The initial substrate and graded layer are then removed through either wafer thinning or delamination methods. The resulting structure is a fully relaxed SiGe layer on oxide (FIG. 12D). A strained silicon layer 1210 can subsequently be grown on the engineered substrate to provide a platform for strained silicon, SOI devices (FIG. 12E). The resulting circuits would experience the performance enhancement of strained silicon as well as about an 18% performance improvement from the SOI architecture. In short channel devices, this improvement is equivalent to 3–4 scaling generations at a constant gate length.

A similar fabrication method can be used to provide relaxed SiGe layers directly on Si, i.e., without the presence of the graded buffer or an intermediate oxide. This heterostructure is fabricated using the sequence shown in FIGS. 12A–12D without the oxide layer on the Si substrate. The graded composition layer possesses many dislocations and is quite thick relative to other epitaxial layers and to typical step-heights in CMOS. In addition, SiGe does not transfer heat as rapidly as Si. Therefore, a relaxed SiGe layer directly on Si is well suited for high power applications since the heat can be conducted away from the SiGe layer more efficiently.

Other Digital Gates

Figure 13A:
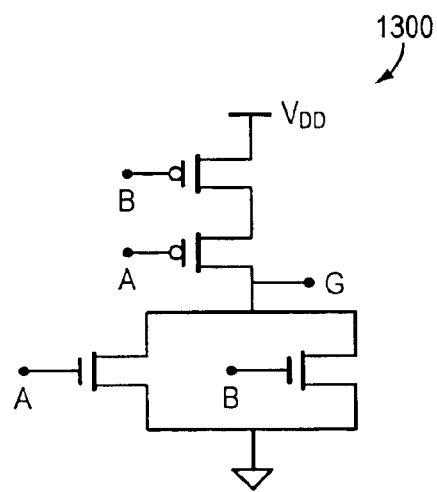
FIGS. 13A–13C are circuit schematics for a NOR gate, a NAND gate and a XOR gate, respectively.
Figure 13B:
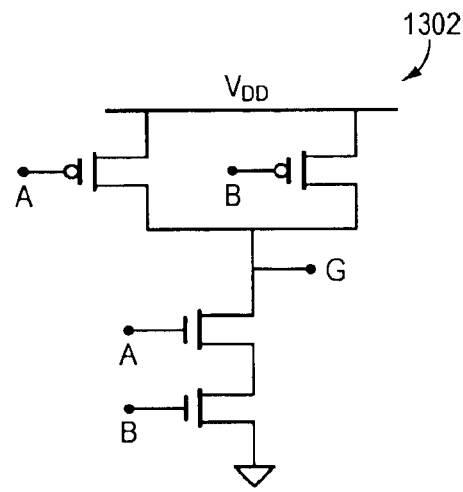
Figure 13C:
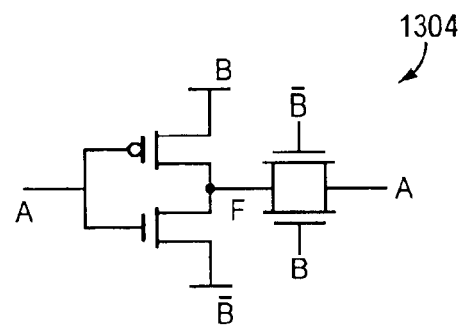

Although the preceding embodiments describe the performance of a CMOS inverter, strained silicon enhancement can be extended to other digital gates such as NOR, NAND, and XOR structures. Circuit schematics for a NOR gate 1300, a NAND gate 1302 and a XOR gate 1304 are shown in FIGS. 13A–C, respectively. The optimization procedures are similar to that used for the inverter in that the power consumption and/or propagation delay must be minimized while satisfying the noise margin and area requirements of the application. When analyzing these more complex circuits, the operation speed is determined by the worst-case delay for all of the possible inputs.

For example, in the pull down network of the NOR gate 1300 shown in FIG. 13A, the worst delay occurs when only one NMOS transistor is activated. Since the resistances are wired in parallel, turning on the second transistor only serves to reduce the delay of the network. Once the worst-case delay is determined for both the high to low and low to high transitions, techniques similar to those applied to the inverter can be used to determine the optimum design.

The enhancement provided by strained silicon is particularly beneficial for NAND-only architectures. As shown in FIG. 13B, in the architecture of the NAND gate 1302, the NMOS devices are wired in series while the PMOS devices are wired in parallel. This configuration results in a high output when either input A or input B is low, and a low output when both input A and input B are high, thus providing a NAND logic function. Since the NMOS devices are in series in the pull down network, the NMOS resistance is equal to two times the device resistance. As a result, the NMOS gate width must be doubled to make the high to low transition equal to the low to high transition.

Since electrons experience a larger enhancement than holes in strained Si, the NMOS gate width up scaling required in NAND-only architectures is less severe. For 1.2 μm strained silicon CMOS on a $Si_{0.8}Ge_{0.2}$ platform, the NMOS gate width must only be increased by 14% to balance the pull down and pull up networks (assuming the enhancements shown in FIG. 6). Correspondingly, for 1.2 μm CMOS on $Si_{0.7}Ge_{0.3}$, the NMOS width must be increased by 55% since the n and p enhancements are more balanced. The high electron mobility becomes even more important when there are more than two inputs to the NAND gate, since additional series-wired NMOS devices are required.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a CMOS inverter, the method comprising the steps of:
    providing a heterostructure including a Si substrate, a $Si_{1-x}Ge_x$ layer on the Si substrate, and a strained layer on the $Si_{1-x}Ge_x$ layer, the heterostructure comprising an interface, located between the strained layer and the Si substrate, that exhibits a roughness less than 1 nm, whereby the strained layer exhibits a surface roughness less than 1 nm; and
    integrating a pMOSFET and an nMOSFET in the heterostructure, wherein a channel of the pMOSFET and a channel of the nMOSFET are formed in the strained surface layer.

2. The method of claim 1 wherein the $Si_{1-x}Ge_x$ layer is relaxed.

3. The method of claim 1 wherein the heterostructure further comprises an underlying insulator layer.

4. The method of claim 1 wherein $0.1 < x < 0.5$.

5. A method of fabricating an integrated circuit comprising:
    providing a heterostructure having a Si substrate and a strained layer thereover, the strained layer exhibiting a surface roughness less than 1 nm; and
    forming a p transistor and an n transistor in the heterostructure, wherein the strained layer comprises a channel of at least one of the transistors, the transistors being interconnected in a CMOS circuit.

6. The method of claim 5 wherein the heterostructure further comprises an insulating layer below the strained layer.

7. The method of claim 5 wherein the heterostructure further comprises a SiGe graded buffer layer positioned between the relaxed $Si_{1-x}Ge_x$ layer and the Si substrate.

8. The method of claim 5 wherein the strained layer comprises Si.

9. The method of claim 5 wherein $0.1<x<0.5$.

10. The method of claim 5 wherein the CMOS circuit comprises a logic gate.

11. The method of claim 10 wherein the logic gate is a NOR gate.

12. The method of claim 10 wherein the logic gate is an XOR gate.

13. The method of claim 10 wherein the logic gate is a NAND gate.

14. The method of claim 5 wherein the p-channel transistor serves as a pull-up transistor in the CMOS circuit and the n-channel transistor serves as a pull-down transistor in the CMOS circuit.

15. The method of claim 5 wherein the heterostructure further comprises a $Si_{1-x}Ge_x$ layer below the strained layer.

16. The method of claim 5 wherein an interface including an unexposed face of the strained layer exhibits a roughness less than 1 nm.

* * * * *